(12) United States Patent
Nedev

(10) Patent No.: US 12,710,602 B2
(45) Date of Patent: Aug. 18, 2026

(54) STRUCTURES FOR A QUANTUM SENSOR

(71) Applicant: GlobalFoundries U.S. Inc., Malta, NY (US)

(72) Inventor: Nayden Petkov Nedev, Sofia (BG)

(73) Assignee: GlobalFoundries U.S. Inc., Malta, NY (US)

( * ) Notice: Subject to any disclaimer, the term of this patent is extended or adjusted under 35 U.S.C. 154(b) by 289 days.

(21) Appl. No.: 18/656,689

(22) Filed: May 7, 2024

(65) Prior Publication Data

US 2025/0347861 A1 Nov. 13, 2025

(51) Int. Cl.

| | |
|---|---|
| ***G02B 6/42*** | (2006.01) |
| ***G01R 33/032*** | (2006.01) |
| ***H10F 39/10*** | (2025.01) |
| ***H10F 77/40*** | (2025.01) |

(52) U.S. Cl.

CPC ......... *G02B 6/4202* (2013.01); *G01R 33/032* (2013.01); *G02B 6/4274* (2013.01); *H10F 39/10* (2025.01); *H10F 77/413* (2025.01); *H10F 77/496* (2025.01)

(58) Field of Classification Search

CPC ... G02B 6/4202; G02B 6/4274; H10F 77/413; H10F 77/496; H10F 39/10; G01R 33/032

USPC ........................................................... 385/14

See application file for complete search history.

(56) References Cited

U.S. PATENT DOCUMENTS

| | | | | |
|---|---|---|---|---|
| 10,459,041 | B2 | 10/2019 | Hahn et al. | |
| 10,962,610 | B2 | 3/2021 | Ibrahim et al. | |
| 11,768,153 | B1 * | 9/2023 | Pawlak | G02B 6/29338 356/451 |
| 2019/0235031 | A1 * | 8/2019 | Ibrahim | G01R 33/032 |
| 2023/0154318 | A1 * | 5/2023 | Nguyen | G01R 33/032 324/244.1 |

OTHER PUBLICATIONS

Y. Bian et al., "3D Integrated Laser Attach Technology on a 300-mm Monolithic CMOS Silicon Photonics Platform," in IEEE Journal of Selected Topics in Quantum Electronics, vol. 29, No. 3: Photon. Elec. Co-Inte. and Adv. Trans. Print., pp. 1-19, May-Jun. 2023, Art No. 8200519, doi: 10.1109/JSTQE.2023.3238290.

Achard, Jocelyn & Jacques, V & Tallaire, Alexandre. (2020). "CVD diamond single crystals with NV centres: a review of material synthesis and technology for quantum sensing applications." Journal of Physics D: Applied Physics. 53. 10.1088/1361-6463/ab81d1.

Tim Schröder et al., "Review Article: Quantum Nanophotonics in Diamond," Journal of Optical Society of America B; pp. 1-24; 33, B65-B83 (2016).

(Continued)

*Primary Examiner* — Jerry M Blevins

(74) *Attorney, Agent, or Firm* — Thompson Hine LLP; Anthony Canale

(57) ABSTRACT

Structures for a quantum sensor and methods of forming such structures. The structure comprises a first waveguide core, a second waveguide core, and a sensor layer laterally between the first waveguide core and the second waveguide core. The first waveguide core is laterally coupled to the sensor layer, the second waveguide core is laterally coupled to the sensor layer, and the sensor layer comprises a material including a plurality of defect centers capable of photoluminescence.

20 Claims, 2 Drawing Sheets

(56) References Cited

OTHER PUBLICATIONS

A. Marinins et al., "Wafer-Scale Hybrid Integration of InP DFB Lasers on Si Photonics by Flip-Chip Bonding With sub-300 nm Alignment Precision," in IEEE Journal of Selected Topics in Quantum Electronics, vol. 29, No. 3: Photon. Elec. Co-Inte. and Adv. Trans. Print., pp. 1-11, May-Jun. 2023, Art No. 8200311, doi: 10.1109/JSTQE.2022.3223641.

Tran, M.A., Zhang, C., Morin, T.J. et al. "Extending the spectrum of fully integrated photonics to submicrometre wavelengths." Nature 610, 54-60 (2022). https://doi.org/10.1038/s41586-022-05119-9.

Y. Bian et al., "Integrated Laser Attach Technology on a Monolithic Silicon Photonics Platform," 2021 IEEE 71st Electronic Components and Technology Conference (ECTC), San Diego, CA, USA, 2021, pp. 237-244, doi: 10.1109/ECTC32696.2021.00048.

* cited by examiner

STRUCTURES FOR A QUANTUM SENSOR

BACKGROUND

The disclosure relates to photonic chips and, more specifically, to structures for a quantum sensor and methods of forming such structures.

Photonic chips are used in many applications and systems including, but not limited to, data communication systems and data computation systems. A photonic chip includes a photonic integrated circuit comprised of photonic devices, such as modulators, polarizers, and optical couplers, that are used to manipulate light received from a light source, such as an optical fiber or a laser.

Quantum sensors can detect a physical quantity, such as the field strength of a magnetic field and temperature, with high sensitivity. Because of their detection capabilities, quantum sensors are of interest for biomedical applications, as well as other applications. Conventional quantum sensors are large in size and their constituent elements are not scalable, which imposes a limitation on their deployment.

Improved structures for a quantum sensor and methods of forming such structures are needed.

SUMMARY

In an embodiment of the invention, a structure for a photonic device is provided. The structure comprises a first waveguide core, a second waveguide core, and a sensor layer laterally between the first waveguide core and the second waveguide core. The first waveguide core is laterally coupled to the sensor layer, the second waveguide core is laterally coupled to the sensor layer, and the sensor layer comprises a material including a plurality of defect centers capable of photoluminescence.

In an embodiment of the invention, a method of forming a structure for a photonic device is provided. The method comprises forming a first waveguide core and a second waveguide core, and forming a sensor layer laterally between the first waveguide core and the second waveguide core. The first waveguide core is laterally coupled to the sensor layer, the second waveguide core is laterally coupled to the sensor layer, and the sensor layer comprises a material including a plurality of defect centers capable of photoluminescence.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
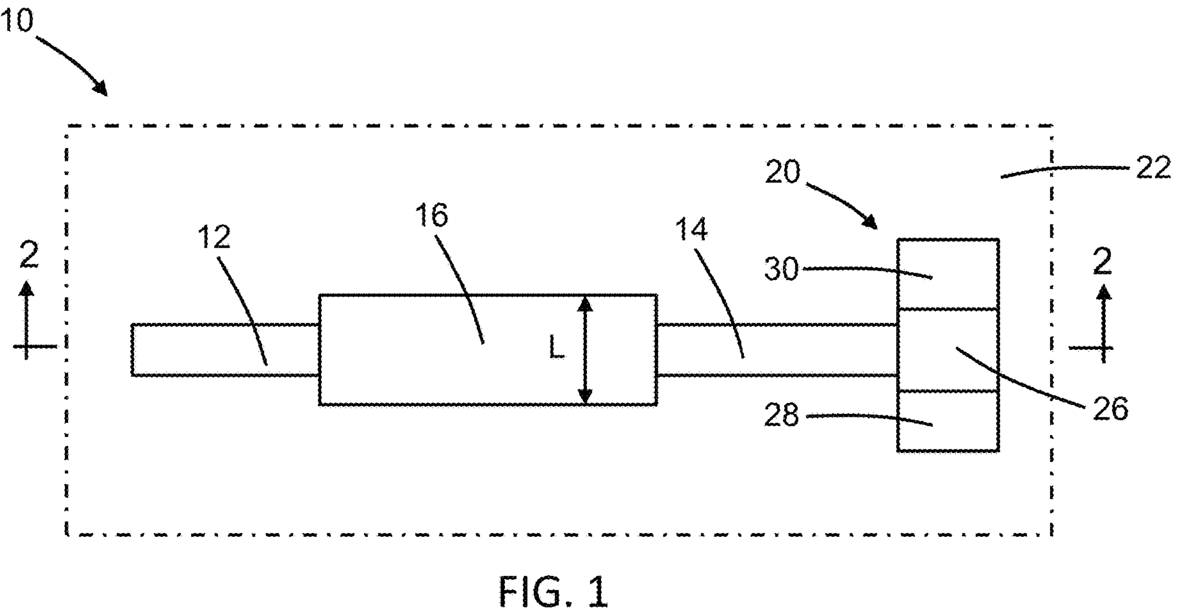
FIG. 1 is a top view of a structure at an initial fabrication stage of a processing method in accordance with embodiments of the invention.
Figure 2:
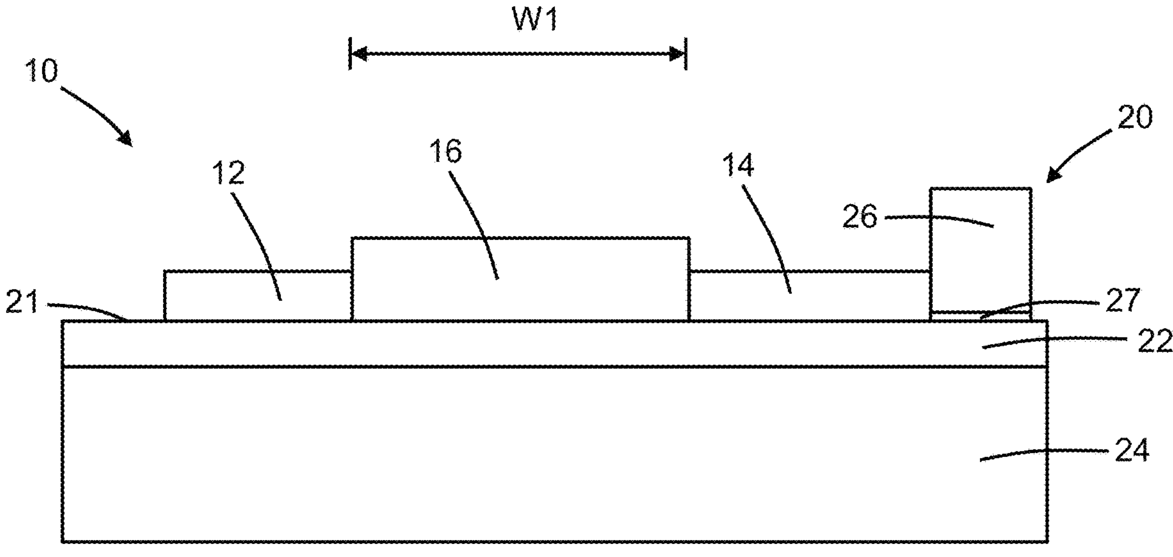
FIG. 2 is a cross-sectional view taken generally along line 2-2 in FIG. 1.

With reference to FIGS. 1, 2 and in accordance with embodiments of the invention, a structure 10 includes a waveguide core 12, a waveguide core 14, a sensor layer 16 laterally between the waveguide core 12 and the waveguide core 14, and a photodetector 20 optically coupled by the waveguide core 14 to the sensor layer 16. The waveguide cores 12, 14, the sensor layer 16, and the photodetector 20 may be positioned on, and above, a dielectric layer 22 and a semiconductor substrate 24. In an embodiment, the dielectric layer 22 may be comprised of a dielectric material, such as silicon dioxide, and the semiconductor substrate 24 may be comprised of a semiconductor material, such as single-crystal silicon. In an embodiment, the dielectric layer 22 may be a buried oxide layer of a silicon-on-insulator substrate, and the dielectric layer 22 may provide low-index cladding. In an embodiment, the dielectric layer 22 may include an additional layer of dielectric material that is disposed on the buried oxide layer of the silicon-on-insulator substrate.

In an embodiment, the waveguide cores 12, 14 may be comprised of a dielectric material, such as silicon nitride, silicon oxynitride, or aluminum nitride. In an embodiment, the waveguide cores 12, 14 may be concurrently formed by patterning a layer of their constituent material with lithography and etching processes. In an alternative embodiment, the waveguide cores 12, 14 may be comprised of a semiconductor material, such as single-crystal silicon. In an alternative embodiment, the waveguide cores 12, 14 may be comprised of a different semiconductor material, such as polysilicon or amorphous silicon. In alternative embodiments, other materials, such as a III-V compound semiconductor, may be used to form the waveguide cores 12, 14.

The photodetector 20 further includes a semiconductor layer 26, an anode 28, and a cathode 30 in which the semiconductor layer 26 may be laterally between the anode 28 and cathode 30. The semiconductor layer 26 of the photodetector 20 may be comprised of a light-absorbing material that can generate charge carriers (e.g., electrons) from photons of absorbed light by photoelectric conversion. The light-absorbing material of the semiconductor layer 26 may be selected to efficiently detect light of a particular wavelength range. For example, the material constituting the semiconductor layer 26 may be optimized to detect light having a red visible wavelength. In an embodiment, the semiconductor layer 26 may be comprised of an intrinsic semiconductor material. In an embodiment, the semiconductor layer 26 may be comprised of intrinsic germanium. In an embodiment, the semiconductor layer 26 may be comprised of intrinsic silicon-germanium. In an alternative embodiment, the semiconductor layer 26 may be comprised of a different type of semiconductor material, such as a III-V compound semiconductor material or intrinsic silicon. The anode 28 and cathode 30 may be formed in a pad 27 on which the semiconductor layer 26 is formed by, for example, epitaxial growth, and the anode 28 and cathode 30 may comprise doped semiconductor material.

The sensor layer 16 may be considered to be a waveguide core that is laterally coupled (i.e., butt coupled) to the waveguide core 12 and that is also laterally coupled to the waveguide core 14. The sensor layer 16 may be located in the same plane as the waveguide core 12 and may also be located in the same plane as the waveguide core 14. In an embodiment, the dielectric layer 22 may have a planar top surface 21, and the waveguide core 12, the waveguide core 14, and the sensor layer 16 may be arranged in a same plane as the dielectric layer 22 on the planar top surface 21. The sensor layer 16 may have a nonoverlapping relationship with the waveguide core 12 and a nonoverlapping relationship with the waveguide core 14. The non-overlapping relationships may promote efficient light coupling by lateral transfer in comparison with overlapping relationships. The sensor layer 16 may have an area that is proportional to a width W1 and a length L in a horizontal plane.

The sensor layer 16 guides light received as input from the waveguide core 12 for interaction with the material of the sensor layer 16, and then guides light from the sensor layer 16 as output to the waveguide core 14. The light input to the sensor layer 16 may differ from the light output from the sensor layer 16. For example, the light input to the sensor layer 16 may have a different wavelength than the light output from the sensor layer 16 due to interaction of the light with the material of the sensor layer 16.

The sensor layer 16 may be comprised of a material configured to provide a sensing function. For example, the material constituting the sensor layer 16 may be suitable for sensing the field strength of an external magnetic field. In an embodiment, the sensor layer 16 may be comprised of a material that includes a concentration of defect centers, also referred to as color centers, capable of generating photoluminescence by absorbing light at a certain wavelength of the electromagnetic spectrum and emitting light at a different wavelength of the electromagnetic spectrum. For example, the material constituting the sensor layer 16 may absorb light having a green visible wavelength (e.g., 532 nanometers) and emit photoluminescent light having a red visible wavelength (e.g., 600 nanometers to 800 nanometers). In an embodiment, the sensor layer 16 may be comprised of diamond that includes a concentration of nitrogen-vacancy centers.

In an embodiment, the sensor layer 16 may be formed and patterned with lithography and etching processes. In an embodiment, the sensor layer 16 may be formed by depositing diamond with, for example, plasma-assisted chemical vapor deposition, followed by processing to introduce nitrogen into the diamond by, for example, ion implantation, processing to create vacancies as point defects in the crystal structure by exposure to high energy particles, such as high energy electrons or high energy ions (e.g., protons), and annealing at a temperature, such as a temperature of 800° C., to form the nitrogen-vacancy centers. In alternative embodiments, nitrogen may be introduced in situ during plasma-assisted chemical vapor deposition instead of by implantation. In alternative embodiments, vacancies may be formed by laser ablation or implantation of a species, such as carbon, that is more massive than protons. In an alternative embodiment, the sensor layer 16 may be separately formed and then bonded as a coupon to the dielectric layer 22.

Figure 3:
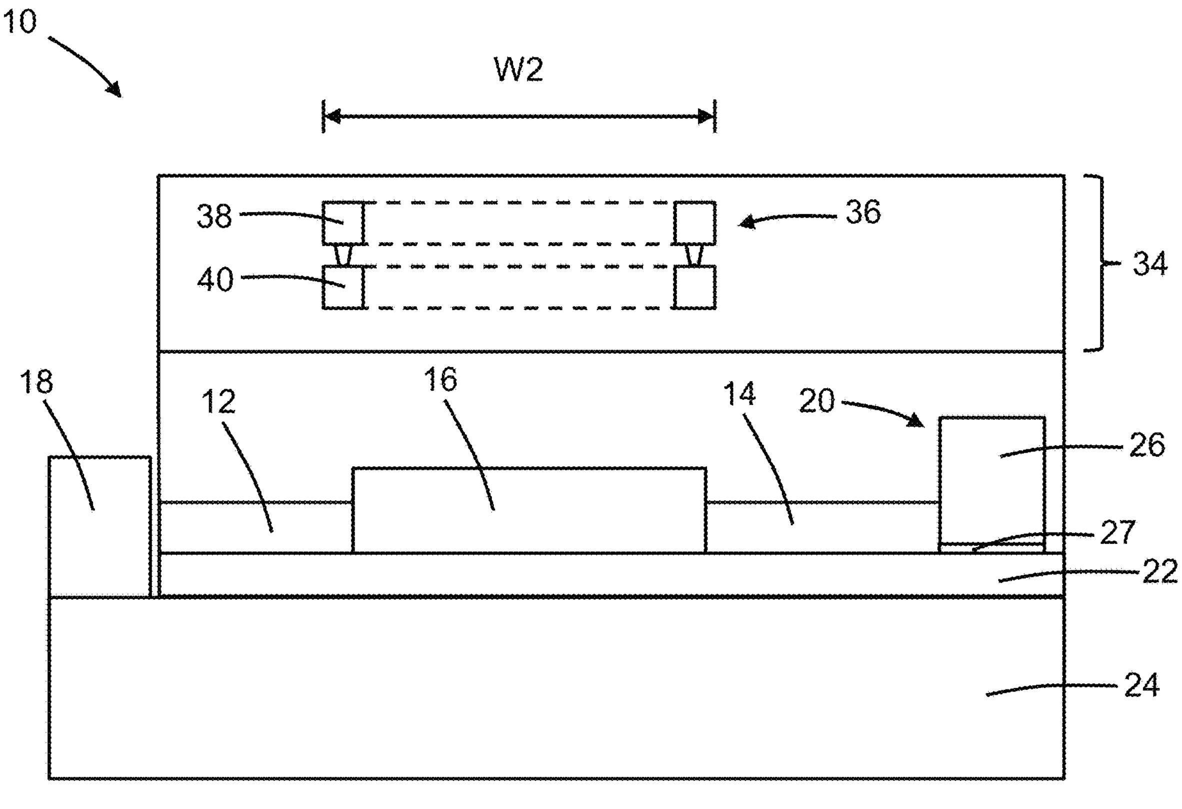
FIG. 3 is a cross-sectional view of the structure at a fabrication stage of the processing method subsequent to FIGS. 1, 2.

With reference to FIG. 3 in which like reference numerals refer to like features in FIGS. 1, 2 and at a subsequent fabrication stage, a back-end-of-line stack 34 including one or more dielectric layers may be formed over the waveguide cores 12, 14, the sensor layer 16, and the photodetector 20. The back-end-of-line stack 34 may include an inductor 36 representing an exemplary microwave source that is disposed adjacent to the sensor layer 16. The inductor 36 may include one or more interconnected coil turns 38, 40 that are disposed in one or more metallization levels of the back-end-of-line stack 34 over the sensor layer 16. The coil turns 38, 40 of the inductor 36 may have, in a horizontal plane, a footprint with an outer perimeter surrounding an area that is greater than or equal to the area of the sensor layer 16. For example, the coil turns 38, 40 of the inductor 36 may have a footprint with a width W2 that is greater than or equal to the width W1 of the sensor layer 16 and a length that is also greater than or equal to the length L of the sensor layer 16.

A laser source 18 may be disposed adjacent to the waveguide core 12. In an embodiment, the laser source 18 may be disposed in a cavity that is patterned in the back-end-of-line stack 34, dielectric layer 22, and semiconductor substrate 24. The laser source 18 is optically coupled by the waveguide core 12 to the sensor layer 16. In an embodiment, the laser source 18 may be a semiconductor laser that is configured to emit laser light of a given wavelength, intensity, mode shape, and mode size. In an embodiment, the laser source 18 may be a semiconductor laser that is configured to emit laser light at a wavelength of the electromagnetic spectrum suitable for a sensor application. In an embodiment, the laser source 18 may be a semiconductor laser that is configured to emit laser light at a green visible wavelength. In an embodiment, the laser source 18 may be a pre-packaged semiconductor laser that is flip-chip mounted inside the cavity to establish electrical connections used to power the semiconductor laser and to mate with mechanical features that ensure alignment of the laser output with the waveguide core 12.

In use, light, such as laser light, propagates in the waveguide core 12 toward the sensor layer 16 and is transferred from the waveguide core 12 to the sensor layer 16. The light received from the waveguide core 12 optically pumps the defect centers in the material of the sensor layer 16. The defect centers in the material of the sensor layer 16 are characterized by a spin-dependent photoluminescence that can be manipulated by an external factor, such as an external magnetic field, that can modify the energy levels of the defect centers and produce the off-resonate optical excitation. The inductor 36 generates microwave radiation that excites the defect centers to cause a spin transition from "no spin" to "spin up" or "spin down". In the absence of an external magnetic field, the energy levels associated with "spin up" and "spin down" are degenerate. When an external magnetic field is applied, the transition from "no spin" to "spin up" and the transition from "no spin" to "spin down" differ in energy level because of the Zeeman effect, which results in a pair of spin resonance frequencies. The difference between the spin resonance frequencies is proportional to the field strength of the external magnetic field. By comparing the difference between the spin resonance frequencies to the frequency at which the material of the sensor layer 16 generates fluorescence radiation when the external magnetic field is absent, the field strength of the external magnetic field can be determined. The fluorescence radiation is laterally transferred from the sensor layer 16 by the waveguide core 14 to the photodetector 20, which can measure the fluorescence radiation emitted by the optically-excited defect centers. The semiconductor layer 26 of the photodetector 20 absorbs photons of the laterally-transferred light and converts the absorbed photons into charge carriers by photoelectric conversion. The biasing of the anode 28 and cathode 30 causes the charge carriers to be collected and output from the photodetector 20 to provide, as a function of time, a measurable photocurrent for use in detecting the spin resonance frequencies.

The structure 10 may function as a quantum sensor that can detect a physical quantity, such as a magnetic field, with high sensitivity. Because of their detection capabilities, quantum sensors based on the structure 10 may be used in multiple different applications, such as biomedical applications. The quantum sensor embodied in the structure 10 may be smaller than conventional quantum sensors and the constituent elements of the quantum sensor embodied in the structure 10 are scalable, which relaxes limitations on their deployment in multiple different applications (e.g., biomedical applications).

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a photonic device, the structure comprising:

a first waveguide core;

a second waveguide core;

a sensor layer laterally between the first waveguide core and the second waveguide core, the first waveguide core laterally coupled to the sensor layer, the second waveguide core laterally coupled to the sensor layer, and the sensor layer comprising a material including a plurality of defect centers capable of photoluminescence; and a microwave source comprising an inductor that is positioned over the sensor layer, the inductor configured to generate microwave radiation, wherein the sensor layer has a first area, the inductor has a second area, and the second area is greater than or equal to the first area of the sensor layer.

2. The structure of claim 1 wherein the first waveguide core and the second waveguide core comprise silicon nitride.

3. The structure of claim 1 wherein the first waveguide core and the second waveguide core comprise silicon.

4. The structure of claim 1 wherein the sensor layer, the first waveguide core, and the second waveguide core are arranged in a same plane.

5. The structure of claim 1 wherein the material of the sensor layer is diamond, and the defect centers are nitrogen-vacancy centers.

6. The structure of claim 5 wherein the sensor layer has a first non-overlapping relationship with the first waveguide core.

7. The structure of claim 6 wherein the sensor layer has a second non-overlapping relationship with the second waveguide core.

8. The structure of claim 1 further comprising:

a laser source optically coupled by the first waveguide core to the sensor layer.

9. The structure of claim 8 further comprising:

a photodetector optically coupled by the second waveguide core to the sensor layer.

10. The structure of claim 1 further comprising:

a photodetector optically coupled by the second waveguide core to the sensor layer.

11. The structure of claim 10 wherein the photodetector includes a semiconductor layer comprising germanium.

12. The structure of claim 1 wherein the sensor layer has a first non-overlapping relationship with the first waveguide core.

13. The structure of claim 12 wherein the sensor layer has a second non-overlapping relationship with the second waveguide core.

14. The structure of claim 1 further comprising:

a semiconductor substrate; and a dielectric layer between the semiconductor substrate and the first waveguide core, the second waveguide core, and the sensor layer.

15. The structure of claim 14 further comprising:

a back-end-of-line stack on the semiconductor substrate, wherein the inductor is arranged in the back-end-of-line stack.

16. The structure of claim 15 wherein the dielectric layer has a planar top surface, and the sensor layer, the first waveguide core, and the second waveguide core are arranged in a same plane on the planar top surface.

17. The structure of claim 15 further comprising:

a laser source optically coupled by the first waveguide core to the sensor layer.

18. The structure of claim 17 further comprising:

a photodetector optically coupled by the second waveguide core to the sensor layer.

19. A method of forming a structure for a photonic device, the method comprising:

forming a first waveguide core and a second waveguide core;

forming a sensor layer laterally between the first waveguide core and the second waveguide core; and forming a microwave source comprising an inductor that is positioned over the sensor layer, wherein the first waveguide core is laterally coupled to the sensor layer, the second waveguide core is laterally coupled to the sensor layer, the sensor layer comprises a material including a plurality of defect centers capable of photoluminescence, the inductor is configured to generate microwave radiation, the sensor layer has a first area, the inductor has a second area, and the second area is greater than or equal to the first area of the sensor layer.

20. The method of claim 19 wherein the material of the sensor layer comprises diamond, and forming the sensor layer laterally between the first waveguide core and the second waveguide core comprises:

depositing the diamond with plasma-assisted chemical vapor deposition; and forming nitrogen-vacancy centers as the defect centers in the diamond.

* * * * *